US007887989B2

(12) United States Patent
Lonkin

(10) Patent No.: US 7,887,989 B2
(45) Date of Patent: Feb. 15, 2011

(54) COMPOSITIONS AND PROCESSES FOR PREPARING COLOR FILTER ELEMENTS

(75) Inventor: Alex Sergey Lonkin, Kennett Square, PA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 599 days.

(21) Appl. No.: 11/951,972

(22) Filed: Dec. 6, 2007

(65) Prior Publication Data

US 2009/0148788 A1 Jun. 11, 2009

(51) Int. Cl.
*G03F 7/00* (2006.01)
*G03F 7/004* (2006.01)
*G02B 5/20* (2006.01)

(52) U.S. Cl. ........................ 430/270.1; 430/7; 430/199; 430/200; 430/201; 430/905

(58) Field of Classification Search ............. 430/270.1, 430/7, 905, 200, 201
See application file for complete search history.

(56) References Cited

U.S. PATENT DOCUMENTS

| | | | | |
|---|---|---|---|---|
| 4,782,131 | A | 11/1988 | Sweeny | |
| 5,071,502 | A | 12/1991 | Hashimoto et al. | |
| 5,512,931 | A | 4/1996 | Nakajima et al. | |
| 5,725,989 | A * | 3/1998 | Chang et al. | 430/201 |
| 5,958,561 | A * | 9/1999 | Held | 428/207 |
| 6,235,098 | B1 * | 5/2001 | Maekawa et al. | 106/31.61 |
| 6,407,037 | B1 * | 6/2002 | Prugh et al. | 503/227 |
| 6,482,768 | B1 * | 11/2002 | Yoshinari et al. | 503/227 |
| 6,645,681 | B2 * | 11/2003 | Andrews et al. | 430/7 |
| 6,653,031 | B2 * | 11/2003 | Baba et al. | 430/7 |
| 7,018,751 | B2 * | 3/2006 | Andrews et al. | 430/7 |

FOREIGN PATENT DOCUMENTS

EP 1 186 592 A1 3/2002

OTHER PUBLICATIONS

Rosowsky et al., "Methotrexate Analogues. 18. Enhancement of the Antitumor Effect of Methotrexate and 3',5'-Dichloromethotrexate by the Use of Lipid-Soluble Diesters", J. Med. Chem., 26, 1983, pp. 1448-1452.

Cohen et al., "Esterification of Polymeric Carboxylic Acids", J. of Polymer Science, Polymer Chemistry Edition, vol. 14, 1976, pp. 7-22.

Crombez-Robert, et al., "Tin-mediated regioselective etherification and esterification of unprotected xylitol", Carbohydrate Research 307, 1998, pp. 355-359.

* cited by examiner

*Primary Examiner*—Amanda C. Walke

(57) ABSTRACT

Provided are compositions derived from a polycarboxylic acid, a copper phthalocyanine complex, and a plasticizer. The compositions can be used to prepare color filter films that exhibit lower lip heights, suitable in color filter elements, for example, in liquid crystal display devices.

33 Claims, 2 Drawing Sheets

COMPOSITIONS AND PROCESSES FOR PREPARING COLOR FILTER ELEMENTS

FIELD OF THE INVENTION

The present invention provides compositions for preparing color filter films that exhibit lower lip heights. The films can be used in color filter elements, for example, in liquid crystal display devices.

BACKGROUND

Thermal transfer processes that use radiation to transfer material from a donor element to a receiver element are known. Thermal transfer imaging processes are used in applications such as color proofing, electronic circuit manufacture, the manufacture of monochrome and color filters, and lithography.

Color filters can be manufactured by thermally transferring a layer of colored material from a donor element onto a receiver. Typically, the transferred layer comprises a polymeric material and one or more dyes and/or pigments. The polymeric material can comprise a cross-linkable binder that can be cured to form a more chemically and physically stable layer, one that is less susceptible to damage.

There remains needed, however, to identify compositions that when annealed produce color filters with lower lip heights.

SUMMARY OF THE INVENTION

Figure 1:
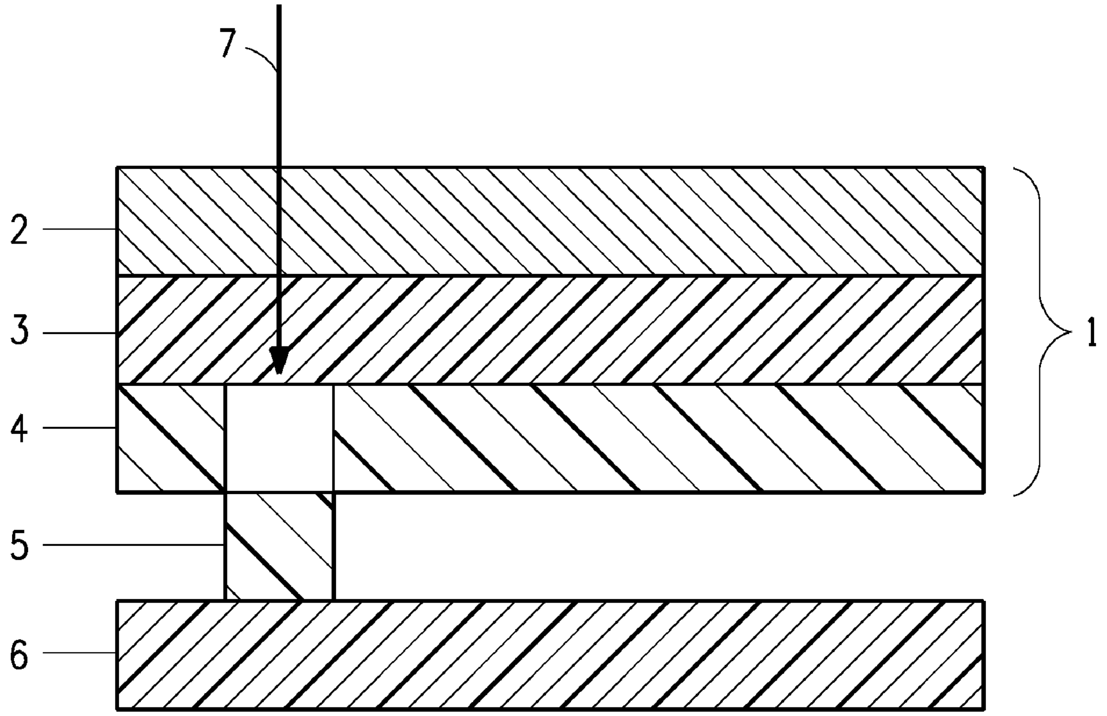
FIG. 1 is a schematic of an imageable assemblage and a thermal laser printing process.
Figure 2:
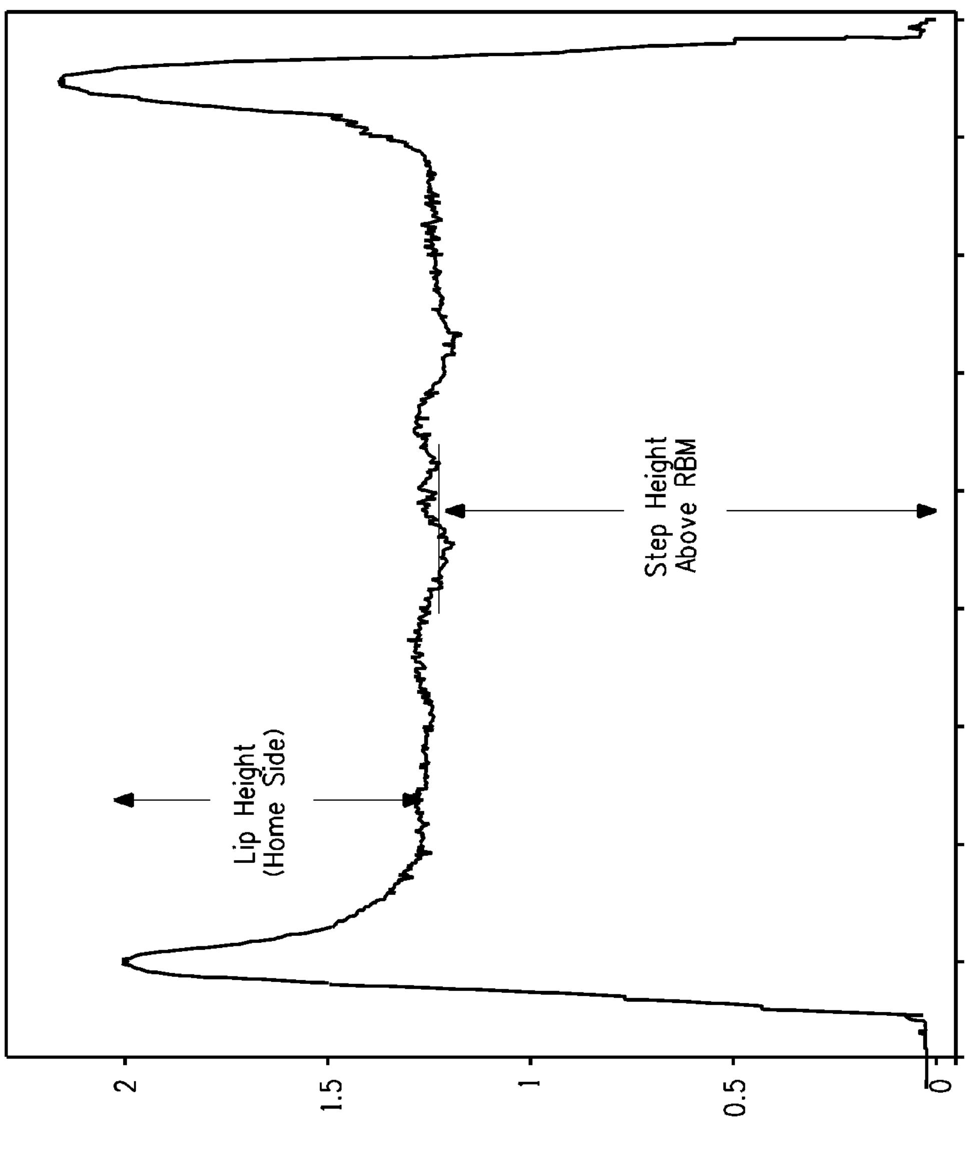
FIG. 2 is a height profile of a typical color filter, showing the step height above RBM and the lip height.

One aspect of the present invention is a thermal transfer donor element comprising:

a. a support; and b. a thermal transfer layer disposed upon the support, wherein the thermal transfer layer is derived from a composition comprising a polycarboxylic acid, a copper phthalocyanine complex, and a plasticizer; and c. a laser dye.

The donor element can be used in a thermal transfer process.

Another aspect of the present invention is a process comprising:

a. coating a support with a composition comprising:

(i) a polycarboxylic acid;

(ii) a plasticizer;

(iii) a copper phthalocyanine complex; and (iv) a laser dye; and heating the coated support.

Another aspect of the present invention is a process comprising:

a. coating a support with a composition comprising:

(i) a polycarboxylic acid;

(ii) a plasticizer;

(iii) a copper phthalocyanine complex; and (iv) a laser dye; and b. heating the coated support.

Another aspect of the present invention is an imageable assemblage comprising:

a. a donor element comprising a transparent donor support with a first and second surface, and a thermal transfer layer disposed on the second surface of the support, wherein the thermal transfer layer is derived by heating to 40° C. to 60° C. a composition comprising a polycarboxylic acid, a copper phthalocyanine complex, and a plasticizer; and b. a receiver in contact with the thermal transfer layer of the donor element.

DETAILED DESCRIPTION

The present invention provides compositions for preparing color filter films that exhibit reduced lip height characteristics. The term "lip heights" is known to those skilled in the art of color filter technology. "Lower lip heights", as used herein, means smaller than the standard lips without catalysts or fugitive plasticizer. Precursors of the films can be used in donor elements in thermal transfer processes. The color filter films can be used, for example, in liquid crystal display devices.

One embodiment is a thermal transfer donor element comprising a support, a thermal transfer layer disposed upon the support, and a laser dye. As the term is used herein, a "laser dye" is "laser dye" is a molecule that is able to absorb radiation energy at the frequency of a chosen incident laser wavelength and convert that energy efficiently into heat. The thermal transfer donor element can further comprise a heating layer disposed between the support and the thermal transfer layer.

The thermal transfer layer is derived from a composition comprising a polycarboxylic acid, a copper phthalocyanine complex, and a plasticizer. The composition can further comprise a polyhydroxy compound. The thermal transfer layer can further comprise a colorant selected from the group consisting of organic pigments, inorganic pigments, dyes, and combinations thereof.

The term "polycarboxylic acid" refers to an organic acid containing two or more carboxyl (COOH) groups. Herein, the polycarboxylic acid is a copolymer comprising repeat units derived from styrene and one or more carboxylic comonomers, wherein the carboxylic comonomers are selected from the group consisting of acrylic acids, methacrylic acids, and combinations thereof. The polycarboxylic acid copolymer used in the thermal transfer layer has a molecular weight of 2,000 to 50,000 g/mole, preferably 3,000 to 14,000 g/mole.

The polyhydroxy compound is selected from the group consisting of 7,7,11,11-tetrakis[2-(2-hydroxyethoxy)ethoxy]-3,6,9,12,15-pentaoxahepta-decane-1,17-diol and N1,N1,N7,N7-tetrakis (2-hydroxyethyl)heptanediamide. The thermal transfer layer can further comprise a surfactant and/or a defoaming agent. Suitable surfactants include salts of 3-[2-(perfluoroalkyl)ethylthio]propionate. Lithium salts are preferred. Suitable defoaming agents include acetylenic glycol non-ionic surfactants.

The polycarboxylic acid and polyhydroxy compound can react to form a cross-linkable polymer.

The support used in the thermal transfer donor element comprises a material that is dimensionally stable and can withstand the heat of a thermal printing process. Suitable support materials are selected from the group consisting of polyester films, polyolefin films, polyamide films, paper, glass, and fluoro-olefin films. Preferred supports are transparent to infrared or near infrared radiation.

If present in the donor element, the heating layer comprises a compound selected from the group consisting of organic and inorganic materials, wherein the materials inherently absorb laser radiation.

The inorganic materials of the heating layer are selected from the group consisting of carbon black, transition metal elements (scandium, yttrium, titanium, zirconium, hafnium, vanadium, niobium, tantalum, chromium, molybdenum, tungsten, manganese, iron, ruthenium, osmium, cobalt, rhodium, iridium, nickel, palladium, platinum, copper, silver, and gold), metallic elements (aluminum, gallium, indium, tin, lead, antimony, and alloys thereof), metal oxides, and alloys of aluminum, gallium, tin, or lead with the alkaline metals or alkaline earth metals (sodium, lithium, calcium, magnesium, and strontium).

The organic materials of the heating layer are laser-radiation absorbing compounds selected from the group consisting of infrared or near infrared absorbing dyes. Examples of suitable near infrared absorbing dyes that can be used alone or in combination include poly(substituted) phthalocyanine compounds and metal-containing phthalocyanine compounds; cyanine dyes; squarylium dyes; croconium dyes; metal thiolate dyes; oxyindolizine dyes; bis(chalcogenopyrylo)polymethine dyes; bis(aminoaryl)polymethine dyes; merocyanine dyes; and quinoid dyes. For imaging applications, it is also typical that the dye has very low absorption in the visible region.

A laser dye is present in the thermal transfer layer and/or a heating layer disposed between the support and the thermal transfer layer. Suitable laser dyes include 1H-benz[e]indolium, 2-[2-[2-chloro-3-[[1,3-dihydro-1,1-dimethyl-3-(4-sulfobutyl)-2H-benz[e]indol-2-ylidene]ethylidene]-1-cyclohexen-1-yl]ethenyl]-1,1-dimethyl-3-(4-sulfobutyl)-, inner salt and related structures.

There is a vast array of pigments known. Pigments are selected for use in the present invention based on their ability to provide the desired color and on their ability to be dispersed in an aqueous formulation. Many pigments are commercially available in dispersed or dispersible form.

In one embodiment, the colorant of the thermal transfer layer comprises a green pigment and a yellow pigment. The green pigment comprises a copper phthalocyanine complex. Suitable copper phthalocyanine complexes include copper, (1,3,8,16,18,24-hexabromo-2,4,9,10,11,15,17,22,23,25-decachlorophthalocyaninato(2-)); and copper, [tridecachloro-29H,31H-phthalocyaninato(2-)-N29,N30,N31,N32]-.

The yellow pigment comprises an azobarbituric acid metal complex. Suitable yellow pigments include nickel, [[5,5'-(azo-KN1)bis[2,4,6(1H,3H,5H)-pyrimidinetrionato-κO4]](2-)]-, compound with 1,3,5-triazine-2,4,6-triamine.

Suitable red pigments for the thermal transfer layer include 2-(3-oxobenzo[b]thien-2(3H)-ylidene)-benzo[b]thiophene-3(2H)-one and N-(2,3-dihydro-2-oxo-1H-benzimidazol-5-yl)-3-oxo-2-[[2-trifluoromethyl)phenyl]azo]butyramide. Suitable blue pigments for the thermal transfer layer include alpha-copper phthalocyanine and diindolo[2,3-c:2',3'-n] triphenodioxazine, 9,19-dichloro-5,15-diethyl-5,15-dihydro-.

Mixtures of pigments and/or dyes can be used to produce other colors, such as orange or purple.

Another embodiment is a process for preparing a thermal transfer donor element comprising: coating a support with a composition comprising a polycarboxylic acid, a copper phthalocyanine complex, a plasticizer, and a laser dye to form a coated support; and heating the coated support.

The composition used to coat the support is typically prepared as an aqueous formulation comprising 25 to 40 wt % polycarboxylic acid, 31 to 41% copper phthalocyanine complex, and 1 to 15 wt % plasticizer, based on the total weight of the aqueous formulation. In some embodiments, 2 to 8 wt % of the aqueous formulation is a polyhydroxy compound. The composition can further comprise colorants selected from the group consisting of organic pigments, inorganic pigments, dyes, and combinations thereof; surfactants; de-foaming agents; and other additives.

The aqueous formulation is mixed by any of several conventional mixing techniques, and then coated onto the support by any of several conventional coating techniques. One method of coating is described in Example 2.

The coated support can be heated from 40° C. to 60° C. to obtain a dry film of the thermal transfer layer on the support.

The thermal transfer layer can be further heated to 200° C. to 300° C. to produce an annealed film on the support.

Alternatively, the thermal transfer layer can be transferred to a receiver by, for example, a thermal laser printing process before annealing. FIG. 1 depicts one embodiment of a thermal transfer donor element (1) comprising a support (2), an optional heating layer (3), and a thermal transfer layer (4). FIG. 1 also depicts a thermal laser printing process, in which laser radiation (7) is directed to the heating layer, causing a portion (5) of the thermal transfer layer to be released from the donor element and be transferred to the receiver (6).

A further embodiment is an imageable assemblage comprising:

a. a donor element comprising a transparent donor support with a first and second surface, and a thermal transfer layer disposed on the second surface of the support, wherein the thermal transfer layer is derived by heating to 40° C. to 60° C. a composition comprising a polycarboxylic acid, a copper phthalocyanine complex, and a plasticizer; and b. a receiver in contact with the thermal transfer layer of the donor element.

The donor element can further comprise a heating layer disposed between the donor support and the thermal transfer heating layer.

The receiver is selected from the group consisting of polyester films, polyolefin films, polyamide films, paper, sheets of glass, and fluoro-olefin films. For convenience, the terms "sheet" and "film" may be used interchangeably herein. One skilled in the art knows that sheet can be distinguished from film based on thickness. The thickness of a sheet or film is not critical for the present invention, and commercially available sheets and films of suitable materials can be used.

Also provided is a process comprising directing laser radiation to the first surface of a transparent donor support of the donor element of an imageable assemblage; heating a portion of the thermal transfer layer to cause it to transfer to the receiver; and separating the receiver from the donor element.

The thermal laser printing process can be used to make a "color filter element" for use in a liquid crystal display. A color filter element typically includes many three-color pixels, each pixel having three windows, and each window having a different color filter (usually red, blue and green). The color filters partially transmit visible light, so that white light is filtered to become red, blue, and green light after passing through the three filters. The windows can be defined by a black matrix. The arrangement of windows of the same color is commonly mosaic, stripe, or delta patterning.

EXAMPLES

The present invention is further illustrated in the following Examples. These examples are given by way of illustration only. From the above discussion and these examples, one skilled in the art can ascertain the essential characteristics of the present invention, and without departing from the spirit and scope thereof, can make various changes and modifications to adapt it to various uses and conditions.

General Information:

Unless otherwise specified below all chemical reagents were obtained from the Sigma-Aldrich Chemical Co. (St. Louis, Mo.). Pigments were obtained from Penn Color (Doylestown, Pa.).

Carboset® GA 2300 is a carboxylic-acid-containing binder acrylic copolymer (available from Noveon, Inc., Cleveland, Ohio) having a carboxylic acid concentration of approximately 3.6 mM (millimoles) carboxylic acid per gram binder, a Mw of approximately 11,000 grams per mole, and a glass transition temperature of about 70° C., available in a volatile carrier.

SDA-4927 is 2-[2-[2-chloro-3[2-(1,3-dihydro-1,1dimethyl-3-(4-dimethyl-3(4-sulfobutyl)-2H-benz[e]indol-2-ylidene)ethylidene]-1-cyclohexen-1-yl]ethenyl]-1,1-dimethyl-3-(sulfobutyl)-1H-benz[e]indolium,inner salt,free acid [CAS No. 162411-28-1]. SDA-4927 (H.W. Sands Corp., Jupiter, Fla.) is an infrared dye that absorbs light of wavelength about 830 nm.

"FS1" is a fluorosurfactant containing a salt of 3-[2-(perfluoroalkyl)ethylthio]propionate and is available from E. I. du Pont de Nemours and Company, Wilmington, Del.

32G373D is a green pigment that contains (1,3,8,16,18,24-hexabromo-2,4,9,10,11,15,17,22,23,25-decachlorophthalocyaninato(2-)). 32G459D is a green pigment that contains copper, [tridecachloro-29H,31H-phthalocyaninato(2-)-N29, N30,N31,N32]-.

15599-52 is a yellow pigment that contains nickel, [[5,5'-(azo-κN1)bis[2,4,6(1H,3H,5H)-pyrimidinetrionato-κO4]](2-)]-, compound with 1,3,5-triazine-2,4,6-triamine.

Surfynol® DF 110D is a non-ionic, non-silicone, acetylenic-based defoamer for aqueous systems available from Air Products and Chemicals Inc., Allentown, Pa.

Primid® XL-552 is a hydroxyalkylamide crosslinker (bis [N,N'-di(beta-hydroxy-ethyl)]adipamide), available from Rohm and Haas.

Example 1

Preparation of Formulations

De-ionized water and Carboset® GA 2300 solution (28.5 wt % solution, density=1.066 g/L) were added to a vial, followed by addition of pigments: 32G373D green pigment (1.037 g); 32G459D green pigment (0.580 g); and 111498-150A (PY 150) yellow pigment (1.551 g). The mixture was shaken for 5 min. SDA 4927 IR dye (0.015 g) was then added, followed by the addition of the polyhydroxy compound ("polyol"), FS1 (0.060 g), and Surfynol® DF 110D (0.030 g). Finally, the plasticizer (0.0, 0.060, or 0.150 g) was added and the mixture was shaken for 2 to 12 h.

The amount of water, Carboset® GA 2300 solution, polyhydroxy compound, and plasticizer used in each formulation (Samples 1-10 and Comparative Examples A-B) is given in Table 1.

TABLE 1

Composition of Pigmented Formulations

| Sample | Water | Polycarboxylic acid (Carboset ® GA 2300) | Polyol | Plasticizer | Lip Height (μm) |
|---|---|---|---|---|---|
| 1 | 4.936 g | 4.898 g | Primid ® XL-552 0.227 g | Tris(2-ethylhexyl) phosphate 0.150 g | 0.67 |
| 2 | 4.291 g | 5.801 g | Primid ® XL-552 0.060 g | Trimethylphosphate 0.060 g | 0.58 |
| 3 | 4.441 g | 5.591 g | Primid ® XL-552 0.120 g | Trimethylphosphate 0.060 g | 0.48 |
| A | 3.290 g | 5.344 g | Primid ® XL-552 0.240 g | none | 0.78 |
| 4 | 4.127 g | 6.012 g | none | Tris(hydroxymethyl) phosphine 0.060 g | 0.63 |
| 5 | 4.226 g | 6.012 g | none | Trimethylphosphate 0.060 g | 0.61 |
| 6 | 4.452 g | 5.696 g | none | Trimethylphosphate 0.150 g | 0.64 |
| 7 | 4.127 g | 6.012 g | none | Hexamethyl-phosphoramide 0.060 g | 0.47 |
| 8 | 4.127 g | 6.012 g | none | 2',4',5'-trifluoro-acetophenone 0.060 g | 0.41 |
| 9 | 4.353 g | 5.696 g | none | 2',4',5'-trifluoro-acetophenone 0.150 g | 0.60 |
| 10 | 4.127 g | 6.012 g | none | Dimethylsulfoxide 0.060 g | 0.41 |
| 11 | 4.353 g | 5.696 g | none | Dimethylsulfoxide 0.150 g | 0.57 |
| B | 4.290 g | 6.012 g | none | none | 0.78 |

Example 2

General Procedure for Making Donor Elements and Imaging

After a pigmented formulation mixture of Example 1 had been shaken for several hours, the pigmented formulation (10 ml) was placed in a syringe filter and filtered through a 1 μm syringe filter onto a polyester sheet in front of the draw-down bar. The draw-down bar deposited the formulation uniformly across the polyester sheet. The coated polyester sheet was heated in a drying oven for 5 min to form a thermal transfer layer on the polyester sheet.

Imaging was carried out by contacting the thermal transfer layer with a receiver (a glass sheet), and directing laser radiation through the transparent donor support (the polyester sheet) and onto the thermal transfer layer. The portion of the thermal transfer layer that had been exposed to the laser radiation was transferred to the glass and remained on the glass when the polyester sheet and the receiver were separated.

Example 3

Color Filter Lip Height Reduction

The process described in Example 2 was carried out to provide a green color filter for each formulation, where each color filter was separated from other color filters by a rubber black matrix (RBM). The glass and transferred layers were then annealed at 230° C. for 1 h in air.

After annealing, the color filters were analyzed using a KLA-Tencor Profilometer to determine the lip height of each color filter above the RBM level.

As can be seen in Table 1, the lip heights of the color filters that had been formulated using a plasticizer were less than for those color filters formulated without plasticizer. This can be advantageous by facilitating the production of color filter elements with smoother surfaces.

What is claimed is:

1. A thermal transfer donor element comprising:

a. a support; and b. a thermal transfer layer disposed upon the support, wherein the thermal transfer layer is derived from a composition comprising a polycarboxylic acid, a copper phthalocyanine complex, and a plasticizer present in an amount ranging from 1 to 15 wt % of the composition; and c. a laser dye.

2. The donor element of claim 1, wherein the polycarboxylic acid is a copolymer comprising repeat units derived from styrene and a carboxylic comonomer selected from the group consisting of acrylic acids, methacrylic acids, and combinations thereof.

3. The donor element of claim 2, wherein the copolymer has a molecular weight of 2,000 to 50,000 g/mole.

4. The donor element of claim 1, further comprising a polyhydroxy compound selected from the group consisting of:

a. 7,7,11,11-tetrakis[2-(2-hydroxyethoxy)ethoxy]-3,6,9,12,15-pentaoxahepta-decane-1,17-diol; and b. N1,N1,N7,N7-tetrakis (2-hydroxyethyl)heptanediamide.

5. The donor element of claim 1, wherein the plasticizer is selected from the group consisting of tris(alkyl) phosphates, tris(hydroxyalkyl) phosphines, phosphoramides, trifluoroacetophenones, and dialkylsulfoxides.

6. The donor element of claim 1, wherein the thermal transfer layer further comprises a colorant selected from the group consisting of organic pigments, inorganic pigments, dyes, and combinations thereof.

7. The donor element of claim 6, wherein the colorant is selected from the group of red pigments, blue pigments, green pigments, yellow pigments, carbon black and laser dyes.

8. The donor element of claim 7, wherein the green pigment comprises a copper phthalocyanine complex and the yellow pigment comprises an azobarbituric acid metal complex.

9. The donor element of claim 8, wherein the copper phthalocyanine complex is selected from the group consisting of:

a. copper, (1,3,8,16,18,24-hexabromo-2,4,9,10,11,15,17,22,23,25-decachlorophthalocyaninato(2-)); and b. copper, [tridecachloro-29H,31H-phthalocyaninato(2-)-N29,N30,N31,N32]-; and wherein the yellow pigment comprises nickel, [[5,5'-(azo-KN1)bis[2,4,6 (1H,3H,5H) -pyrimidinetrionato-κO4]](2-)]-, compound with 1,3,5-triazine-2,4,6-triamine.

10. The donor element of claim 1, wherein the laser dye is 1H-benz[e]indolium, 2-[2-[2-chloro-3-[[1,3-dihydro-1,1-dimethyl-3-(4-sulfobutyl)-2H-benz[e]indol-2-ylidene]ethylidene]-1-cyclohexen-1-yl]ethenyl]-1,1-dimethyl-3-(4-sulfobutyl)-, inner salt.

11. The donor element of claim 1, wherein the thermal transfer layer further comprises a surfactant and a defoaming agent.

12. The donor element of claim 11, wherein the surfactant comprises a salt of a 3-[2-(perfluoroalkyl)ethylthio]propionate and the defoaming agent comprises an acetylenic glycol nonionic surfactant.

13. The donor element of claim 1, further comprising a heating layer disposed between the support and the thermal transfer layer.

14. The donor element of claim 13, wherein the heating layer comprises a material selected from the group consisting of carbon black, scandium, titanium, chromium, manganese, iron, cobalt, nickel, copper, ruthenium, rhodium, palladium, silver, gold, and hafnium; aluminum, gallium, tin, lead and alloys thereof; metal oxides; and alloys of aluminum, gallium, tin, or lead with sodium, lithium, calcium, magnesium, or strontium; poly(substituted) phthalocyanine compounds and metal-containing phthalocyanine compounds; cyanine dyes; squarylium dyes; croconium dyes; metal thiolate dyes; oxyindolizine dyes; bis(chalcogenopyrylo)polymethine dyes; bis(aminoaryl)polymethine dyes; merocyanine dyes; and quinoid dyes.

15. The donor element of claim 1, wherein the laser dye is present in the transfer layer or is present in the heating layer disposed between the support and the thermal transfer layer.

16. The donor element of claim 1, wherein the support is selected from the group consisting of polyester films, polyolefin films, polyamide films, paper, sheets of glass, and fluoro-olefin films.

17. A process comprising:

a. a coating a support with a composition comprising:

(i) a polycarboxylic acid;

(ii) a plasticizer comprising 1 to 15 wt % of the composition;

(iii) a copper phthalocyanine complex; and (iv) a laser dye; and b. heating the coated support.

18. The process of claim 17, wherein the composition is an aqueous composition and the polycarboxylic acid comprises 25 to 40 wt % of the composition, and the copper phthalocyanine complex comprises 31 to 41% of the composition.

19. The process of claim 18, wherein the aqueous composition further comprises a colorant selected from the group consisting of an organic pigment, an inorganic pigment, a dye, a color-forming dye and combinations thereof.

20. The process of claim 17, wherein the heating comprises (i) heating the coated support from 40° C. to 60° C. to obtain a dry film; and (ii) heating the dry film from 200° C. to 300° C. to form an annealed film.

21. An imageable assemblage comprising:

a. a donor element comprising a transparent donor support with a first and second surface, and a thermal transfer layer disposed on the second surface of the support, wherein the thermal transfer layer is derived by heating to 40° C. to 60° C. a composition comprising a polycarboxylic acid, a copper phthalocyanine complex, and a plasticizer comprising 1 to 15 wt % of the composition; and b. a receiver in contact with the thermal transfer layer of the donor element.

22. The imageable assemblage of claim 21, wherein the donor element further comprises a heating layer disposed between the donor support and the thermal transfer heating layer.

23. A process comprising:

a. directing laser radiation to a first surface of a transparent donor support of a donor element of an imageable assemblage, wherein the imageable assemblage comprises a donor element comprising a transparent donor support with a first and second surface, and a thermal transfer layer disposed on the second surface of the support; and a receiver in contact with the thermal transfer layer of the donor element;

b. heating a portion of the thermal transfer layer to cause it to transfer to the receiver; and c. separating the receiver from the donor element;

and wherein the thermal transfer layer is derived from a composition comprising a polycarboxylic acid, a copper phthalocyanine complex, and a plasticizer present in an amount ranging from 1 to 15 wt %.

24. The donor element of claim 5, wherein the plasticizer is a tris(alkyl) phosphate.

25. The donor element of claim 5, wherein the plasticizer is a tris(hydroxyalkyl) phosphine.

26. The donor element of claim 5, wherein the plasticizer is a phosphoramide.

27. The donor element of claim 5, wherein the plasticizer is a trifluoroacetophenone.

28. The donor element of claim 5, wherein the plasticizer is a dialkylsulfoxide.

29. A thermal transfer donor element comprising:

(a) a support; and (b) a thermal transfer layer disposed upon the support, wherein the thermal transfer layer is derived from a composition comprising a polycarboxylic acid, a copper phthalocyanine complex, and a plasticizer selected from the group consisting of tris(hydroxyalkyl) phosphines, phosphoramides, trifluoroacetophenones, and dialkylsulfoxides; and (c) a laser dye.

30. The donor element of claim 29, wherein the plasticizer is a tris(hydroxyalkyl) phosphine.

31. The donor element of claim 29, wherein the plasticizer is a phosphoramide.

32. The donor element of claim 29, wherein the plasticizer is a trifluoroacetophenone.

33. The donor element of claim 29, wherein the plasticizer is a dialkylsulfoxide.

* * * * *